US010761121B2

(12) United States Patent
Kolof et al.

(10) Patent No.: US 10,761,121 B2
(45) Date of Patent: Sep. 1, 2020

(54) METHOD FOR PROCESSING A SINGLE-EDGE NIBBLE TRANSMISSION SIGNAL, DATA RECEIVING DEVICE AND DATA TRANSMISSION DEVICE

(71) Applicant: Infineon Technologies AG, Neubiberg (DE)

(72) Inventors: Andreas Kolof, Unterhaching (DE); Dietmar Koenig, Munich (DE)

(73) Assignee: Infineon Technologies AG, Neubiberg (DE)

( * ) Notice: Subject to any disclaimer, the term of this patent is extended or adjusted under 35 U.S.C. 154(b) by 501 days.

(21) Appl. No.: 15/693,510

(22) Filed: Sep. 1, 2017

(65) Prior Publication Data

US 2018/0067153 A1 Mar. 8, 2018

(30) Foreign Application Priority Data

Sep. 2, 2016 (DE) ......................... 10 2016 116 426

(51) Int. Cl.
*H04L 1/00* (2006.01)
*G01R 23/06* (2006.01)
*H04L 1/20* (2006.01)
*G01R 19/175* (2006.01)

(52) U.S. Cl.
CPC ............... *G01R 23/06* (2013.01); *H04L 1/00* (2013.01); *H04L 1/20* (2013.01); *G01R 19/175* (2013.01)

(58) Field of Classification Search
CPC ......... G01R 23/06; G01R 19/175; H04L 1/00; H04L 1/20
See application file for complete search history.

(56) References Cited

U.S. PATENT DOCUMENTS

| 6,404,248 | B1 * | 6/2002 | Yoneda | H03L 7/0814 |
| | | | | 327/158 |
| 7,508,242 | B2 * | 3/2009 | Tokuno | H03K 5/1534 |
| | | | | 326/83 |
| 7,680,005 | B2 * | 3/2010 | Lin | G11B 7/00375 |
| | | | | 369/53.16 |
| 8,250,911 | B2 * | 8/2012 | Bauerle | G01M 15/02 |
| | | | | 73/114.36 |
| 9,396,738 | B2 * | 7/2016 | Abdelal | G10L 25/30 |
| 9,720,873 | B2 * | 8/2017 | Drescher | H04L 12/403 |
| 2007/0188449 | A1 * | 8/2007 | Choi | G06F 3/0325 |
| | | | | 345/157 |
| 2007/0217559 | A1 * | 9/2007 | Stott | H04L 7/0037 |
| | | | | 375/355 |
| 2008/0259747 | A1 * | 10/2008 | Lin | G11B 7/00375 |
| | | | | 369/30.36 |

(Continued)

FOREIGN PATENT DOCUMENTS

DE 102014110082 B3 10/2015

*Primary Examiner* — Esaw T Abraham
(74) *Attorney, Agent, or Firm* — Viering, Jentschura & Partner MBB (57) ABSTRACT

In various embodiments, a method for processing a Single-Edge Nibble Transmission Signal is provided. The method includes determining of at least one drop in a signal level of the time-variable Single-Edge Nibble Transmission Signal and at least one next rise in the signal level after the drop in the signal level, determining a time interval between the drop and the next rise in the signal level, and determining a quality of the Single-Edge Nibble Transmission Signal by using the time interval.

13 Claims, 7 Drawing Sheets

(56) References Cited

U.S. PATENT DOCUMENTS

2010/0229053 A1* 9/2010 Kushnick .......... G01R 31/3016
　　　　　　　　　　　　　　　　　　　714/704
2016/0020797 A1 　1/2016 Hammerschmidt et al.

* cited by examiner

METHOD FOR PROCESSING A SINGLE-EDGE NIBBLE TRANSMISSION SIGNAL, DATA RECEIVING DEVICE AND DATA TRANSMISSION DEVICE

CROSS-REFERENCE TO RELATED APPLICATION

This application claims priority to German Patent Application Serial No. 10 2016 116 426.7, which was filed Sep. 2, 2016, and is incorporated herein by reference in its entirety.

TECHNICAL FIELD

Various embodiments relate generally to a method for processing a Single-Edge Nibble Transmission (SENT) signal.

BACKGROUND

The "Single-Edge Nibble Transmission" signal (SENT signal) is understood to be a signal which, for example, is used in the automobile field and in which only one type of edge, typically a falling edge, of the signal is considered. By means of a time interval between two falling edges, an information item is then transmitted.

When using SENT, it is normally necessary that many errors are detected by a receiver of the signal, for example data errors, which can be determined by means of a check code, e.g. by means of a cyclic redundancy check (CRC), frequency shifts, departure from a predetermined frequency range, dropping below a minimum distance or exceeding a maximum distance between two falling edges, exceeding or dropping below an expected number of falling edges, etc.

Usually, signal quality is not considered when an SENT signal is used. This can be based on an assumption that the signal is good (enough) if falling edges are detected at all. And between two falling edges, the signal would also have to have risen again.

If a signal quality is so poor that the falling edges are no longer present, a data error can be detected in a conventional manner.

However, a period between a falling edge and a subsequent rising edge can also be greatly shortened in the case of an SENT signal (also called low-signal period), for example almost negligibly short.

One cause of this can be that parameters of a data transmission device (which can have a transmitter and the receiver) become worse, e.g. contacts can corrode or become detached, or the like. A further cause can be that the system (e.g. deliberately) can be set in this way. In addition, the signal can pass through a low-pass filter in the receiver, which can additionally shorten the low-signal period. Furthermore, the signal can be subjected to further signal processing processes which can have an influence on a steepness of the edges and can thus shorten the low-signal duration.

Although the data transmission device, which can continue to develop a signal having a shortened period of time easily so that the signal no longer has any usable falling edges and thus becomes faulty, a classification of the signal and/or prediction and/or suppression of the error is currently not possible.

An examination of the signal with regard to a susceptibility to errors is not carried out, nor is it provided for.

When the error occurs (i.e. when the falling edges are missing), the signal receiver would find that falling edges are missing in data frames and discard the data frames.

A cause of the error would not be obvious during this event. As a result, difficult and/or expensive repairs in a workshop could appear to be necessary but after the repair the data transmission device overall can still be operated within a threshold range (for example, the contact can still be corroded) so that with only a slight deterioration of the signal-influencing parameters (which can still be within normal tolerances, for example), the data transmission can fail again.

SUMMARY

In various embodiments, a method for processing a Single-Edge Nibble Transmission Signal is provided. The method includes determining of at least one drop in a signal level of the time-variable Single-Edge Nibble Transmission Signal and at least one next rise in the signal level after the drop in the signal level, determining a time interval between the drop and the next rise in the signal level, and determining a quality of the Single-Edge Nibble Transmission Signal by using the time interval.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

In the detailed description following, reference is made to the attached drawings which form a part of said description and in which specific embodiments in which the invention can be practiced are shown for illustration. In this regard, directional terminology such as "above", "below", "front", "rear", etc. is used with respect to the orientation of the figure(s) described. Since components of embodiments can be positioned in a number of different orientations, the directional terminology is used for illustrating and is in no way restrictive. Naturally, other embodiments can be used and structural or logical changes can be carried out without deviating from the protective range of the present invention. Naturally, the features of the various embodiments described here can be combined with one another unless specifically specified differently. The following detailed description should, therefore, not be considered in a restrictive sense and the protective range of the present invention is defined by the attached claims.

Within the context of the present description, the terms "linked", "connected" and "coupled" are used for describing both a direct and an indirect link, a direct or indirect connection and a direct or indirect coupling. In the figures, identical or similar elements are provided with identical reference symbols inasmuch as this is appropriate.

SENT (Single-Edge Nibble Transmission) is here to be understood to be a digital interface by means of which information can be transmitted from a transmitter (e.g. a sensor, e.g. a sensor for a steering angle or for a gas pedal position) or a receiver (e.g. a controller), for example as described in SAE Standard J2716. An SENT signal is a time-variable signal which is designed in accordance with the standard. In this context, a nibble (4 bits) is in each case coded as a time interval between falling edges (only the falling edges, therefore "single edge"). In addition to nibbles for measurement data, the SENT signal usually has nibbles for status and communication (e.g. synchronization, calibration or the like) and for an error detection (e.g. by means of a cyclic redundancy check (CRC)).

Figure 1:
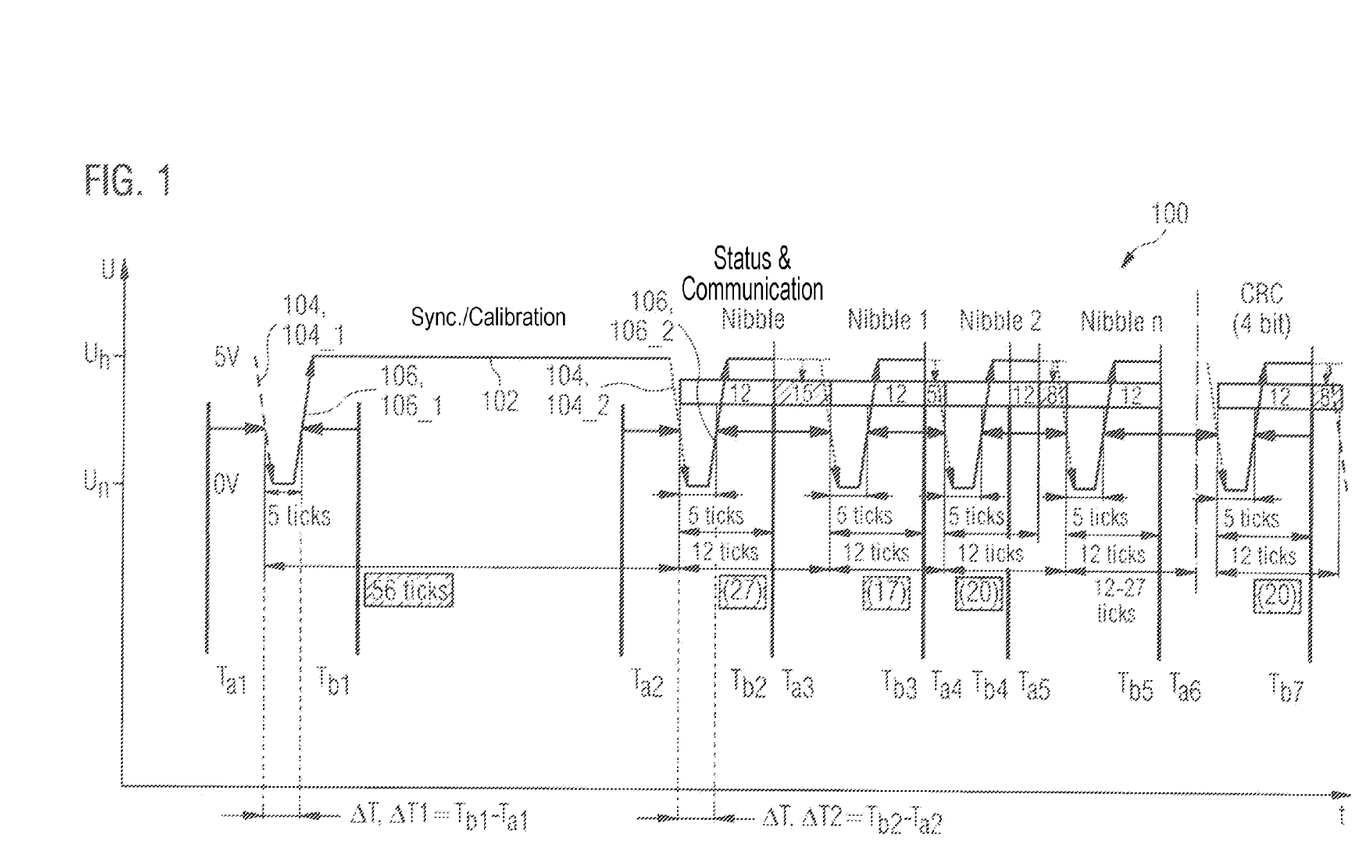
FIG. 1 shows a diagrammatic representation of a time variation of an SENT signal having points determined in accordance with various embodiments.
Figure 2:
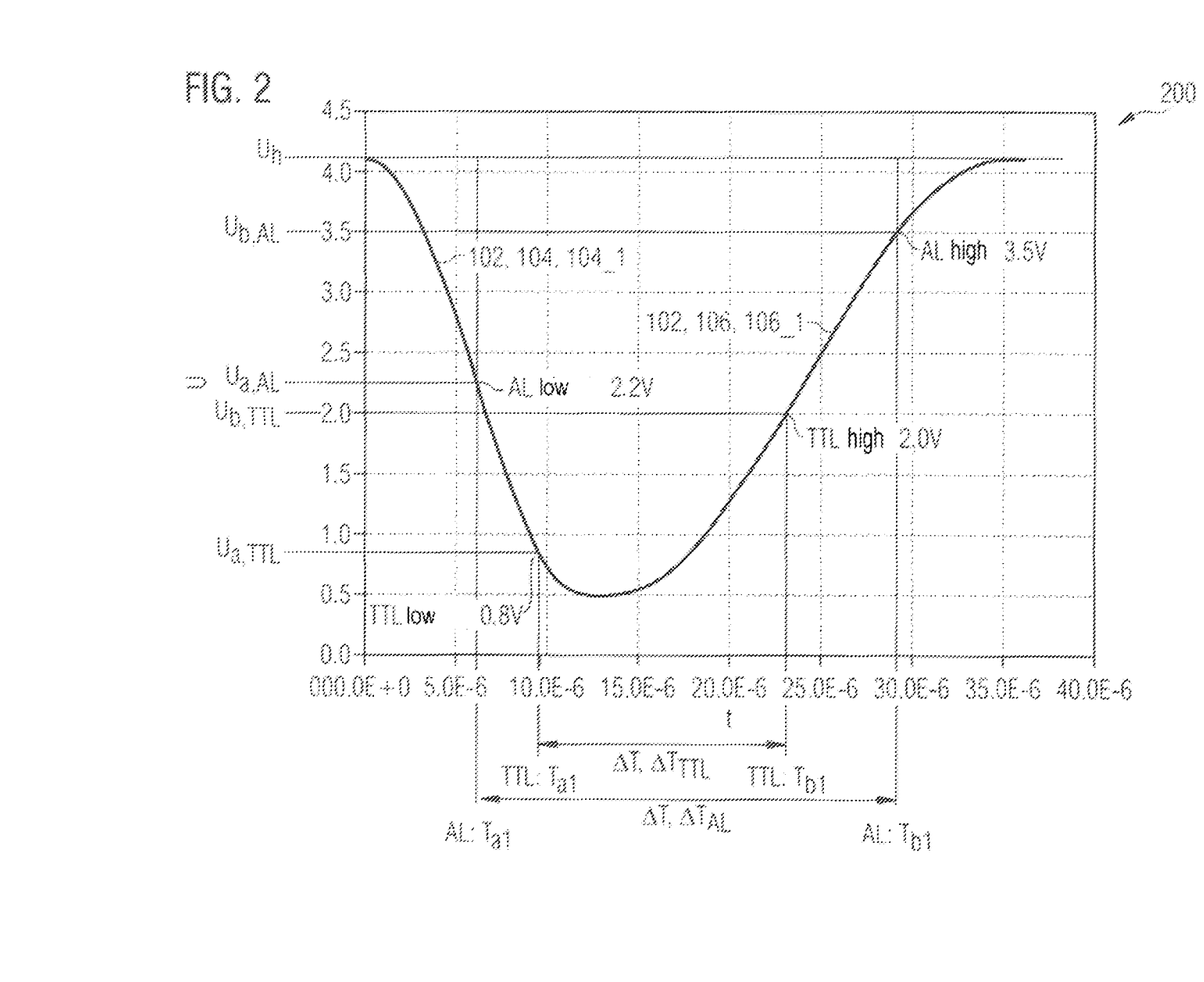
FIG. 2 shows a diagrammatic representation of a drop and of a rise of an SENT signal having points determined in accordance with various embodiments.
Figure 3A:
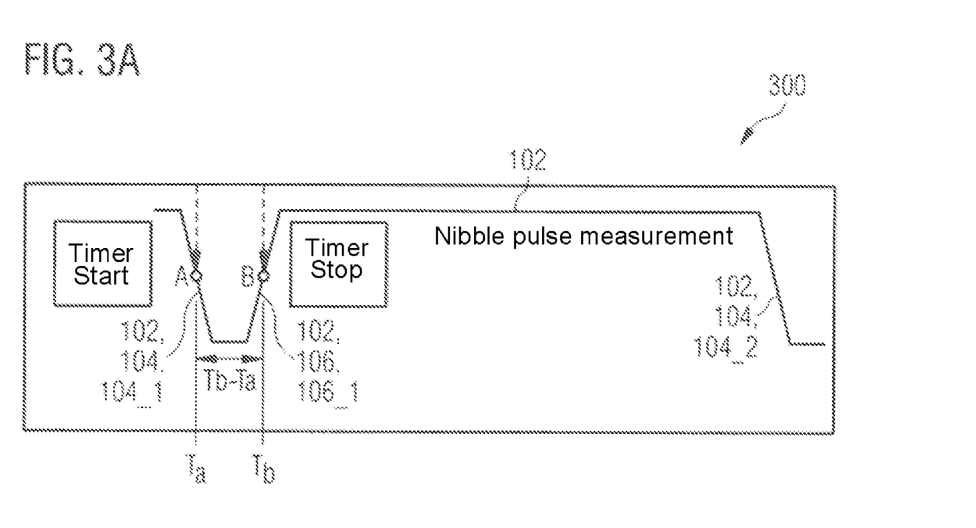
FIG. 3A shows a diagrammatic representation of a time variation of an SENT signal having points determined in accordance with various embodiments.

FIG. 1, FIG. 2 and FIG. 3 show in each case a diagrammatic representation 100, 200 and 300, respectively, of a time variation of an SENT signal having dots determined in accordance with various embodiments, FIG. 2 showing in representation 200 a detailed view of a drop and a rise in the SENT signal.

FIG. 1 shows a time variation of a Single-Edge Nibble Transmission (SENT) signal 102, i.e. a change of a signal level, typically of a voltage U, in dependence on time t, i.e. U(t). To generate the SENT signal 102 or transmit information, the voltage U can be lowered at points in time which correspond to the information to be transmitted, from a high value $U_h$ to a low value $U_n$. By this means, a falling edge (also called falling signal level) 104 can be produced, e.g. a first falling edge 104_1, a second falling edge 104_2, etc. (generally, an nth falling edge is designated as 104_n).

After each drop, the voltage U can rise back to the high value $U_h$ before the next drop. This can result in a rising edge (also called rising signal level) 106, e.g. a first rising edge 106_1, a second rising edge 106_2, etc. (generally, an nth rising edge is designated as 106_n).

In various embodiments, the signal which can be provided as input signal to a receiver can be sampled by means of an analog-to-digital converter (ADC). As a result, a total detailed signal variation can be evaluated during the low-signal periods by means of a software (and, for example, also the signal variation before and during the low-signal period).

Since the SENT signal can be considered a digital replacement of an analog signal, the SENT signals are frequently superposed on an ADC input in automotive applications. This can enable the embodiments described to be provided without additional hardware.

In various embodiments, the drop in the signal level U, 102 of the time-variable Single-Edge Nibble Transmission Signal U(t) can be determined, for example in a familiar manner, for example by means of suitable software. With respect to the falling signal level 104, an associated point in time $T_a$ can be determined, for example in familiar a manner.

In FIG. 1, lines, e.g. denoted with $T_{b2}/T_{a3}$, are to be understood to be dimensioning lines and not as if e.g. the points in time $T_{b2}$ and $T_{b3}$ would coincide.

In various embodiments, the determining of the drop in the signal level 102 may include comparing of the falling signal level 104 with a predetermined first reference value $U_a$. When the first reference value $U_a$ is reached by the falling signal level 104, an associated point in time can be determined as a first point in time $T_a$: $U_a=U(T_a)$.

In various embodiments, the determining of the drop in the signal level 102 can be carried out for more than one drop. To differentiate a numerical index can be used, i.e. $T_{a1}$, $T_{a2}$, ... $T_{an}$ for the first point in time.

For determining the associated point in time as the first point in time $T_a$, a time meter, also called time counter or timer, can be used, for example a (e.g. internal) timer of the receiver. See also the description in conjunction with the following figures in this respect.

In various embodiments, the rise in the signal level U of the time-variable Single-Edge Nibble Transmission Signal U(t) can be determined, for example in familiar manner, for example by means of suitable software. In this context, the rising signal level 106_n can be the rising signal level 106_n of the SENT signal 102 which follows the falling signal level 104_n. In other words, the subsequent rising signal level 106_n can be arranged in such a manner that between the rising signal level 106_n and the (previous) falling signal level 104_n no further rising signal level is arranged. An associated point in time $T_b$ can be determined for the rising signal level 106.

In various embodiments, the determining of the rise in the signal level 102 may include comparing the rising signal level 106 with a predetermined second reference value $U_b$. When the second reference value $U_b$ is reached by the rising signal level 106, an associated point in time can be determined as the second point in time $T_b$: $U_b=U(T_b)$.

In various embodiments, the determining of the rise in the signal level 102 can be carried out for more than one rise. To distinguish between these, a numerical index can be used, i.e. $T_{b1}$, $T_{b2}$, ... $T_{bn}$ for the second point in time.

For determining the associated point in time as second point in time $T_b$, the time meter can be used. See in this respect also the description in conjunction with the following figures.

In various embodiments, a time interval $\Delta T$ between the drop 104_n and the next rise 106_n (i.e., e.g., between the drop 104_1 and the next rise 106_1) of the signal level 102 can be determined. The time interval $\Delta T$ can have a difference of the point in time $T_{bn}$ allocated to the rising signal level and the point in time $T_{an}$ allocated to the falling signal level, i.e. $\Delta T=T_{bn}-T_{an}$.

In various embodiments, a quality of the Single-Edge Nibble Transmission Signal 102 can be determined by means of the time interval determined. In other words, the time interval $\Delta T$ can be used for evaluating the quality of the SENT signal 102.

As stated above, (too) small a time interval $\Delta T$ can mean that the quality of the SENT signal 102 is impaired (e.g. poor).

(Too) small a time interval $\Delta T$ can be understood in various embodiments to mean that the time interval $\Delta T$ is significantly shorter than the time interval to be expected in the SENT signal 102, for example when the time interval $\Delta T$ is less than 90% of the expected time interval, for example less than 80%, e.g. less than 70%, e.g. less than 60%, e.g. less than 50%, e.g. less than 40%, e.g. less than 30%, e.g. less than 20%, e.g. less than 10%.

An unimpaired time interval ΔT0 can be typically at least five ticks long, a length of one tick being able to vary in various data transmission devices. At present, a typical length of one tick can be 3 μs but a shortening of the tick length down to 0.5 μs is presently aimed for.

In various embodiments, a minimum time interval ΔTMin can be determined, for example, by means of the (unimpaired) time interval ΔT0 to be expected and by means of a tolerated (e.g. percentage) shortening of the unimpaired time interval ΔT0.

For example, ΔTMin can be determined, with an unimpaired time interval ΔT0 of five ticks having in each case 3 μs and a desired evaluation of the signal as poor if the time interval ΔT has less than 80% of the expected unimpaired time interval ΔT0, as ΔTMin=(5×3 μs)×0.8=12 μs.

In various embodiments, the determining of a quality of the Single-Edge Nibble Transmission Signal, using the time interval ΔT may include comparing the time interval ΔT with the predetermined minimum time interval ΔTMin, wherein the signal quality can be evaluated as poor if the determined time interval ΔT is less than the predetermined minimum time interval ΔTMin.

Too large a time interval ΔT can also be an indication of a poor signal quality. This can mean, for example, that the signal level 102, after the drop, rises no longer or only very slowly. In an extreme case, this can lead to the initial signal level $U_h$ not being reached before an intended next drop of the signal level 102 for transmitting the information or even the first reference value $U_a$ not being exceeded.

Thus, (too) large a time interval ΔT can mean that the quality of the SENT signal 102 is impaired (e.g. poor).

In various embodiments, (too) large a time interval ΔT can be understood to mean that the time interval ΔT is significantly greater than the time interval to be expected in the SENT signal 102, for example if the time interval ΔT is more than 110% of the expected time interval, for example more than 120%, e.g. more than 130%, e.g. more than 140%, e.g. more than 150%, e.g. more than 160%, e.g. more than 170%, e.g. more than 180%, e.g. more than 190%.

In various embodiments, a maximum time interval ΔTMax can be determined, for example by means of the (unimpaired)time interval ΔT0 to be expected and by means of a tolerated (e.g. percentage) extension of the unimpaired time interval ΔT0.

For example, ΔTMax can be determined, with an unimpaired time interval ΔT0 of five ticks having in each case 3 μs and a desired evaluation of the signal as poor if the time interval ΔT has more than 120% of the expected unimpaired time interval ΔT0, as ΔTMin=(5×3 μs)×1.2=18 μs.

In various embodiments, the determining of a quality of the Single-Edge Nibble Transmission Signal, by using the time interval ΔT, may include comparing the time interval ΔT with the predetermined maximum time interval ΔTMax, the signal quality being able to be evaluated as poor if the time interval ΔT determined is greater than the predetermined maximum time interval ΔTMax.

In various embodiments, the determining of a quality of the Single-Edge Nibble Transmission Signal, by using the timer interval ΔT, may include comparing the time interval ΔT with both the minimum time interval ΔTMin and the predetermined maximum time interval ΔTMax and the signal quality can be evaluated as poor if the time interval ΔT determined is smaller than the predetermined minimum time interval ΔTMin or larger than the predetermined maximum time interval ΔTMax.

Figure 3B:
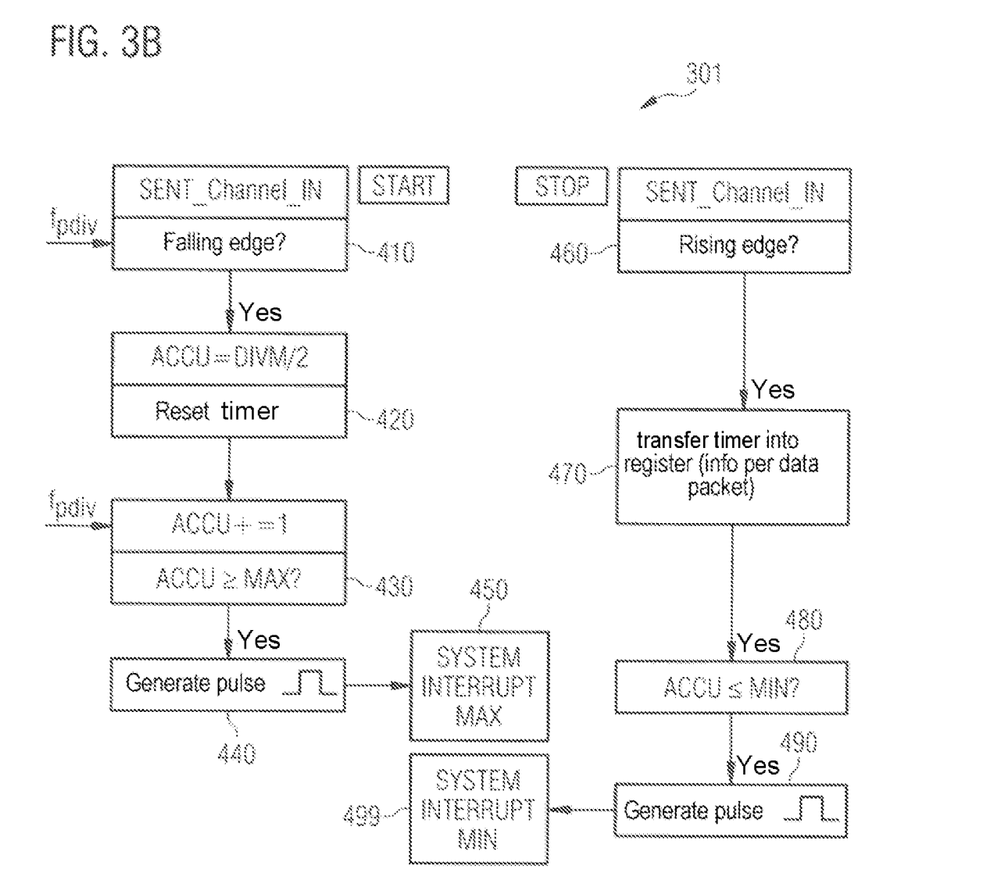
FIG. 3B shows a flowchart for illustrating a generation of an interrupt signal during processing of the SENT signal from FIG. 3A.

In FIG. 3A and FIG. 3B, for example, the determining of the time interval ΔT and a comparing of the time interval ΔT with the predetermined minimum time interval ΔTMin and the predetermined maximum time interval ΔTMax is illustrated.

As is represented in the representation 300 of FIG. 3A, a timer (utilized as time counter) can be started at a point in time $T_a$ allocated to a falling edge 104_1.

This is shown in the method illustrated in FIG. 3B in a view 301 as detecting a falling edge (falling edge? Yes) at an input channel (SENT channel_IN) and providing a signal ($f_{pdiv}$) from a frequency divider (at 410).

In various embodiments, an existing time counter may include e.g. an existing timing module, which can have, for example, the frequency divider. The existing time counter can be connected to an input pin of the data receiving device at which the SENT signal of the data receiving device is also provided.

In various embodiments, the data receiving device or the data transmission device can have two different modules, one module for detecting the information transmitted by means of the SENT signal and a further module for determining the time interval and for evaluating the signal quality.

In various embodiments, the timer can be shifted in familiar manner by half a count in order to avoid oversampling and roundings. This is represented as "ACCU=DIVM/2", "reset timer" (at 420).

Thereupon, the timer can increment in various embodiments and continues to compare its count with a predetermined maximum time interval (shown as "ACCU+=1", "ACCU≥MAX?" (at 430).

In a case where the maximum time interval is exceeded ("yes"), a pulse can be generated in various embodiments ("generate pulse", at 440).

By means of the pulse, an interrupt can be triggered in various embodiments due to a transgression of the maximum time interval (at 450). Alternatively, instead of the interrupt or additionally thereto, further processes can be triggered, for example an information item provided or the like as described above.

As is shown in FIG. 3A, the timer can be stopped at a point in time Tb allocated to a rising edge 106_1.

For this purpose, a count of the timer started with the falling edge 104_1 can be transferred into a register in various embodiments on detection of the rising edge 106_1, shown as "SENT_Channel_IN?", "rising edge?", "yes" (at 460), shown as "transfer timer into register" (info per data packet, at 470).

Following this, the count transferred (successful: "yes") can be compared in various embodiments with a minimum time interval ΔTMin, shown as "ACCU≤MIN?" (at 480).

In a case where the minimum time interval is undercut ("yes"), a pulse can be generated in various embodiments ("generate pulse", at 490).

By means of the pulse, an interrupt can be triggered in various embodiments due to an undercutting of the minimum time interval (at 499). Alternatively, other processes can be triggered instead of the interrupt or in addition thereto, for example an information item can be provided, or the like, as described above.

As can be seen by means of FIG. 2, even if a potentially impaired signal 102 is represented there, the expected (unimpaired) time interval ΔT0 can be dependent in various embodiments on how the point in time $T_a$ is allocated to the falling edge 104 and the point in time Tb to the rising edge 106.

In various embodiments, different signal levels U on the falling edge 104 can be utilized as first reference value $U_a$ for allocating the points in time $T_a$, e.g. depending on requirement, e.g. in accordance with a field of application.

In various embodiments, different signal levels U on the rising edge 106 can be utilized as second reference value $U_b$ for allocating the points in time $T_b$, e.g. depending on requirement, e.g. in accordance with a field of application.

In other words, the reference values $U_a$, $U_b$ (which can also be called limit values) in which the points in time Ta, Tb are determined, can be varied in different embodiments.

In this context, the determined value, i.e. the time interval $\Delta T$, can be shorter when the first reference value $U_a$, the second reference value $U_b$ or both reference values $U_a$, $U_b$ are lower also in the case of an unimpaired signal (e.g. with an undisturbed, "healthy" data receiving device or with an undisturbed, "healthy" data transmission device).

If the signal level 102 does not reach the first reference value $U_a$ in various embodiments, the time interval $\Delta T$ cannot be determined. Similarly, the time interval $\Delta T$ cannot be determined if the signal level 102 reaches the first reference value $U_a$ during the drop but there is either no next rise of the signal level 102 or the reference value $U_b$ is not reached when the signal level rises.

The different signal levels or reference values, respectively, can be used as predetermined combinations of reference values $U_a$, $U_b$ in various embodiments.

In other words, the predetermined first reference value $U_a$ and the predetermined second reference value $U_b$ can form a predetermined combination of reference values $U_a$, $U_b$ in various embodiments.

In various embodiments, the predetermined first reference value $U_a$ and/or the predetermined second reference value $U_b$ can have an absolute signal level, for example a predetermined voltage value. In various embodiments, the predetermined first reference value $U_a$ and/or the predetermined second reference value $U_b$ can have a relative signal level with respect to the initial signal level $U_h$, wherein, before comparing the falling signal level 104 with the first reference value or before comparing the rising signal level 106 with the second reference value by means of the relative signal level (that is to say, e.g., a percentage value) and the initial signal level $U_h$, a corresponding absolute reference value $U_a$ or an absolute reference value $U_b$ can be determined.

In various embodiments, the predetermined combination of reference values can have one of a group of combinations of reference values, the group including a first combination, wherein the first reference value exhibits 2.2 V and the second reference value exhibits 3.5 V (the first combination can also be designated as so-called "Automotive Level" (AL)), a second combination, wherein the first reference value exhibits 0.8 V and the second reference value exhibits 2.0 V (the second combination can also be designated as so-called "Transistor-Transistor Logic" (TTL)), a third combination, wherein the first reference value exhibits 1.39 V and the second reference value exhibits 3.8 V (the third combination can also be designated as SENT), a fourth combination, wherein the first reference value exhibits 0.4 V and the second reference value exhibits 75% of the initial signal level (the fourth combination can also be designated as CMOS level), and a fifth combination which can be determined after a commissioning of a device for carrying out the method and/or in the case of a faultless transmission of the signal. In various embodiments, another predetermined combination of reference values can be utilized.

If a combination of reference values $U_a$, $U_b$ is predetermined, the method for processing a Single-Edge Nibble Transmission Signal can also have a predetermining of the minimum time interval $\Delta TMin$ in dependence on the predetermined combination of reference values $U_a$, $U_b$.

In various embodiments, the evaluation of the signal quality as poor can have a graded evaluation, for example slightly poor to very poor.

For example, in the case of a shortened time interval $\Delta T$ which has between 70% and 90% of the unimpaired time interval $\Delta T0$, the signal quality can be assessed as slightly poor, with a shortened time interval $\Delta T$ between 40% and less than 70% of the unimpaired time interval $\Delta T0$ as medium poor and with a shortened time interval $\Delta T$ between 10% and less than 40% of the unimpaired time interval $\Delta T0$ as very poor.

For example, in the case of an extended time interval $\Delta T$ which exhibits between 110% and 130% of the unimpaired time interval $\Delta T0$, the signal quality can be assessed as slightly poor, in the case of an extended time interval $\Delta T$ between more than 130% and 160% of the unimpaired time interval $\Delta T0$ as medium poor and in the case of an extended time interval $\Delta T$ of between more than 160% and 190% of the unimpaired time interval $\Delta T0$ as very poor.

The grading can be designed arbitrarily in various embodiments, e.g. have arbitrarily many stages and/or arbitrary minimum or maximum time intervals. Furthermore, the evaluation stages for shortened and extended time intervals can be combined, e.g. the signal quality can be assessed as very poor, if the shortened time interval $\Delta T$ exhibits between 10% and less than 40% of the unimpaired time interval $\Delta T0$ or if the extended time interval $\Delta T$ exhibits between more than 160% and 190% of the unimpaired time interval $\Delta T0$.

In various embodiments, the method for processing a Single-Edge Nibble Transmission Signal can also include providing an information item that the signal quality is poor. The information can be presented, for example, by means of a display, entered in a error memory, signaled by means of a lamp or the like.

In various embodiments, it can also be reported during the providing of the information to what extent the signal quality is poor, e.g. whether the time interval is too short or too long.

In various embodiments, the graded evaluation can be provided during the providing of the information.

In various embodiments, a subsequent process can be triggered alternatively or additionally to providing the information.

The subsequent process may include in various embodiments that a program interrupt is triggered. The program interrupt can relate to a program which utilizes the data (information items) received by the data receiving device or the data transmission device, respectively.

The subsequent process may include in various embodiments replacing of a faulty signal with a faultless signal, e.g. a faulty data frame with a faultless data frame.

The faultless signal, e.g. the faultless data frame, can be obtained from the faulty signal, e.g. the faulty data frame, for example, in various embodiments, if in the faulty signal, e.g. in the faulty data frame, the present error is present as a short-term interference signal (also called a glitch).

Figure 4:
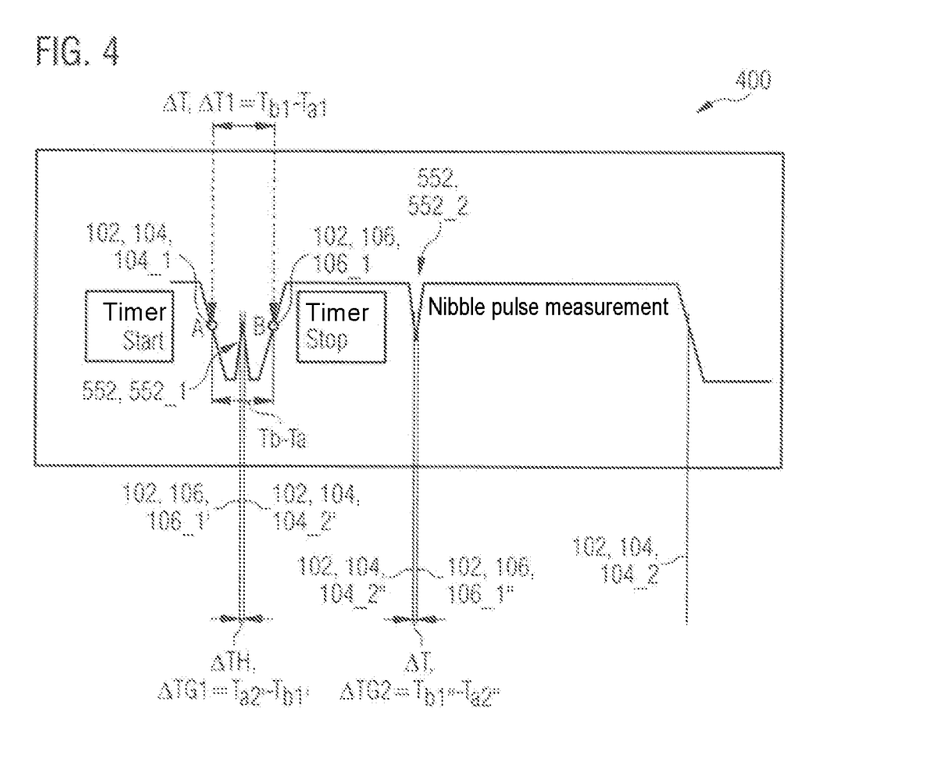
FIG. 4 shows a diagrammatic representation of a time variation of an SENT signal having two short-term interference signals and points determined in accordance with various embodiments.

As shown in FIG. 4, a glitch 552 may include in the case of an SENT signal both a short-term rise of the signal level 102 (for example within a low-signal period $\Delta T$, glitch 552_1) and a short-term drop in the signal level 102 (for example starting from the high value $U_h$, glitch 552_2).

In various embodiments, the determining of at least one drop of a signal level of the time-variable Single-Edge Nibble Transmission Signal and at least of a next rise in the signal level after the drop in the signal level may include a determining of a plurality of drops in a signal level of the time-variable Single-Edge Nibble Transmission Signal and at least one next rise in the signal level after the drop in the signal level.

This is shown, for example, in FIG. 1, where additionally to the first drop 104_1 and the next rise 106_1 (with associated points in time $T_{a1}$, $T_{b1}$ and time interval $\Delta T1$) also a second drop 104_2 and the (associated) next rise 106_2 (with associated points in time $T_{a2}$, $T_{b2}$ and time interval $\Delta T2$) are determined. Furthermore, points in time and time intervals can be determined accordingly for a third drop/rise, fourth drop/rise etc.

As illustrated in FIG. 4, a next rise 106_1' (with an associated point in time $T_{b1'}$) after the first drop 104_1 may have to be allocated not to the actual rise 106_1 to be allocated to the signal to be transmitted but be a part of a short-term interference signal (of a glitch) 552_1.

This can be determined in various embodiments, in that furthermore a drop 104_2' of the glitch 552_1 (with associated point in time $T_{a2'}$) is determined and a high-signal time interval $\Delta TH = T_{a2'} - T_{b1'}$ is determined and compared with a predetermined maximum glitch period (also called a maximum short-term interference signal period). If the high-signal time interval $\Delta TH$ determined is less than or equal to the predetermined maximum glitch period, the rise 106_1' and the drop 104_1' can be detected as rise and drop of the glitch 552_1.

For replacing the faulty signal with the faultless signal, signal levels can be replaced by an undisturbed signal level during a period of the glitch, for example by signal levels immediately before the glitch, immediately after the glitch or, for example, a mean value of the signal levels before and after the glitch. Alternatively or additionally, the signal level can remain uncorrected and only an information item obtained from it by the receiver, i.e. the time intervals determined between the first falling edge 104_1 and the second falling edge 104_2 and between the first falling edge 104_1 and the next rising edge 106_1 can be determined without consideration of the glitch.

Replacing the faulty signal with the faultless signal can be carried out in various embodiments immediately after detection of the glitch or after the data frame has been received completely and thus all information of the data frame or about the data frame is present. Alternatively, it can also be decided not to perform of a correction.

The maximum glitch period can be determined in various embodiments can be determined such that glitches with a known duration can be recognized as glitches.

Correspondingly, in various embodiments, a falling edge 104_2' can be not an edge 104_2 following the first falling edge 104_1 (wherein the time interval between the edges 104_1 and 104_2 can be carriers of information), but part of a glitch 552_2 (in this example of a short-term signal disturbance, in which the signal level 102 is dropping). For the falling edge of the glitch 552_2, as with a "regular" falling edge, a point in time $T_{a2''}$ can be determined. For the next rising edge 106_1'', a point in time $T_{b1''}$ can be determined as in the case of a "regular" rising next edge. A time interval $\Delta T$ which is determined as described in various embodiments to determine the signal quality, can furthermore be compared with the maximum glitch period (maximum short-term interference signal period).

If the time interval $\Delta T$ determined is less than or equal to the predetermined maximum glitch period the drop 104_2' and the rise 106_1'' can be recognized as the drop and rise of the glitch 552_2.

In various embodiments, a filter can be used for detecting and/or suppressing the glitches, e.g. a low-pass filter.

In other words, in various embodiments, the method can also include comparing the time interval $\Delta T$ with a predetermined maximum short-term interference signal period, determining at least one new drop in the signal level after the rise in the signal level, determining a high-signal between the rise and the new drop, comparing the second time interval with the predetermined maximum short-term interference signal period, in a case where the time interval $\Delta T$ and/or the high-signal time interval $\Delta TH$ are/is shorter than the predetermined maximum short-term interference signal period or equal to the predetermined maximum short-term period, evaluating the signal 102 between the drop and the next rise and/or between the rise and the new drop as short-term interference signal, and correcting the signal by means of replacing the short-term interference signal by an undisturbed signal or by means of determining the time intervals, omitting points in time allocated to the short-term interference signal.

Figure 5:
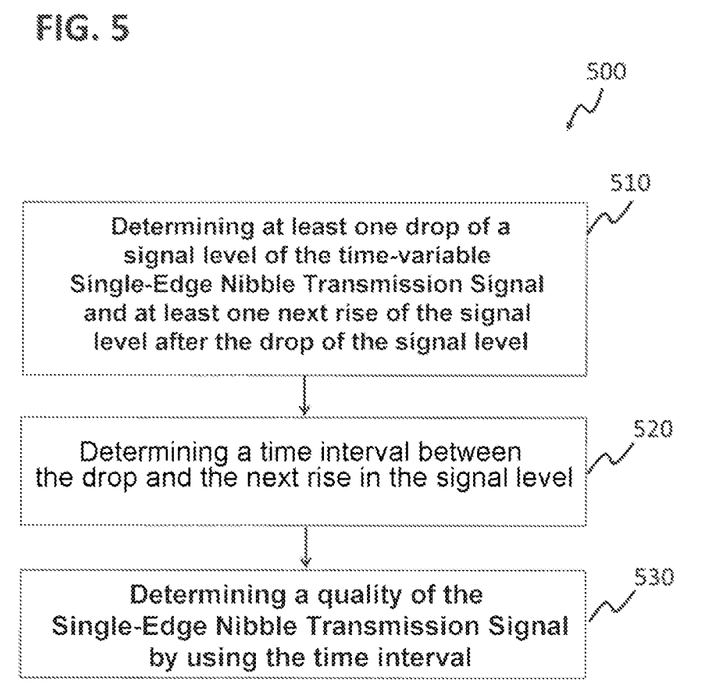
FIG. 5 shows a flowchart for a method for processing an SENT signal according to various embodiments.

FIG. 5 shows a flow chart 500 for a method for processing an SENT signal according to various embodiments.

In various embodiments, the method may include determining of at least one drop in a signal level of the time-variable Single-Edge Nibble Transmission Signal and at least one next rise in the signal level after the drop of the signal level (at 510), determining a time interval between the drop and the next rise of the signal level (at 520), and determining a quality of the Single-Edge Nibble Transmission Signal by using the time interval (at 530).

Figure 6:
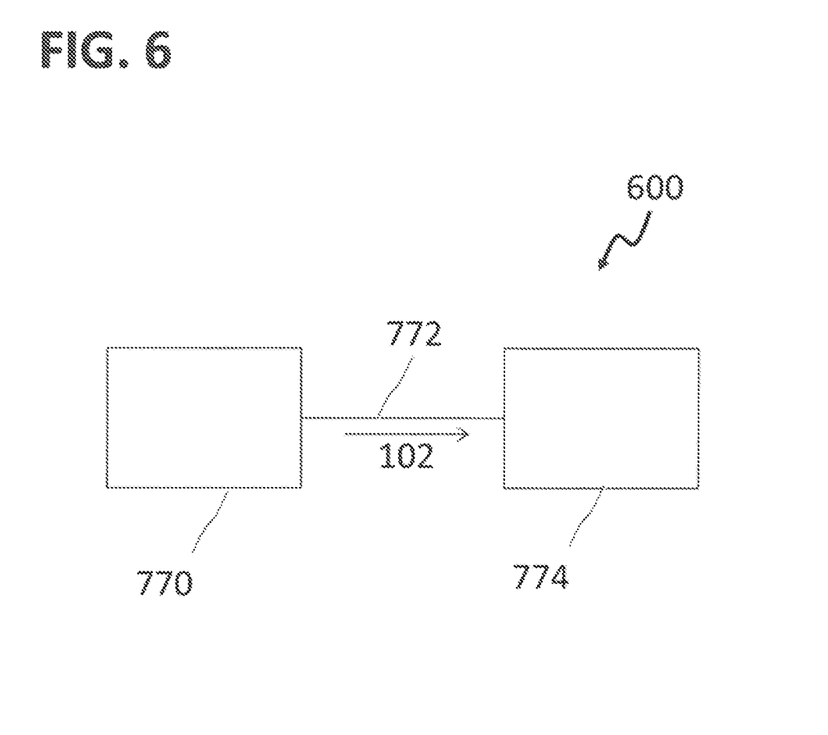
FIG. 6 shows a data transmission device according to various embodiments.

FIG. 6 shows a data transmission device 600 according to various embodiments.

The data transmission device 600 can have a data receiving device 774 which can be configured for carrying out the method according to various embodiments.

The data transmission device 600 can also have a data sending device 770 for sending an SENT signal 102.

In various embodiments, the data transmission device 600 can also have a link 772 which connects the data sending device 770 to the data receiving device 774, for transmitting the SENT signal 102.

In various embodiments, the data sending device 770 can have a sensor.

In various embodiments, the sensor may include a sensor used in a vehicle or can be a sensor used in a vehicle, for example a steering angle sensor, a sensor for a position of a gas pedal, a tire air pressure sensor or the like.

Further embodiments of the method are obtained from the description of the device and vice-versa.

In various illustrative embodiments, a time interval between a falling edge and a rising edge of a signal can be measured by means of a time meter or a similar device in the receiver (e.g. by the receiver).

In various embodiments, a measurement of the time interval can be performed analogously, for example by means of a low-pass filter or by means of a high-pass filter.

In various embodiments, the time interval measured (which can also be called low-signal time or low-signal period) can be compared with a predetermined minimum time interval and/or with a predetermined maximum time interval. The minimum time interval or the maximum time interval can be determined by means of a design of the data transmission device in various embodiments. In various embodiments, the minimum time interval or the maximum time interval can be "learned" by the device, for example during a production of the device, after starting (e.g. running up) the device, for example after a certain number of faultless data frames or by means of other methods.

In various embodiments, the data receiver (and, for example, the user) can be informed, for example by means of an alarm or of an interrupt, that the signal quality is outside an acceptable range and possibly also what a source of the errors is, for example of the missing falling edges, e.g. too short a time interval or too long a time interval.

In various embodiments, a faulty data frame can be repaired, if the cause of the error is a short-term signal interference, for example replaced by a corrected, e.g. faultless data frame. By this means, continuation of an operation of a device depending on faultless data can be provided for.

In various embodiments, a data receiving device or a data transmission device can be set up for detecting errors in a user system, for example a worsening of a quality of connection of data transmission connections in the data transmission device, or data transmission connections which transmit data to the data receiving device. In this context, a worsening of the quality of connection can be caused, for example, by problems in connecting elements, e.g. by oxidation, humidity, displacement of connecting material (e.g. by repeated connecting and detaching of the connection), reduction of a cable diameter (e.g. if a cable is too close to a waste-gas line and, as a result, becomes too hot so that a copper material of the cable can be abraded off at least partially) and/or at least partial grounding of a cable.

In various embodiments, a low-signal period of the SENT signal can be measured and compared with a minimum duration and a maximum duration in order to evaluate the signal quality.

In various embodiments, an alarm and/or a program interruption and possibly other associated processes can be triggered when minimum requirements are not met, e.g. when the duration is not between the minimum duration and the maximum duration.

In various embodiments, a reliability of a data receiving device or a data transmission device, respectively, may be increased.

In various embodiments, a possibility of diagnosis can be improved in a vehicle and/or proposals which are provided to a workshop for a repair can be improved, which reduces a repair period and thus repair costs.

In various embodiments, damaged data frames can be detected and repaired, which can represent an elegant solution for failure-proof systems which are needed, for example, for autonomous driving.

In various embodiments, a method for processing a Single-Edge Nibble Transmission Signal is provided. The method may include determining of at least one drop in a signal level of the time-variable Single-Edge Nibble Transmission Signal and at least one next rise in the signal level after the drop in the signal level, determining a time interval between the drop and the next rise in the signal level and determining a quality of the Single-Edge Nibble Transmission Signal by using the time interval.

In various embodiments, determining a quality of the Single-Edge Nibble Transmission Signal may include comparing the time interval with a predetermined minimum time interval and/or with a predetermined maximum time interval, the signal quality being evaluated as being poor if the time interval is less than the predetermined minimum time interval and/or if the time interval is greater than the predetermined maximum time interval.

In various embodiments, the determining of at least one drop in the signal level may include comparing the dropping signal level with a predetermined first reference value and, when the first reference value is reached by the dropping signal level, determining an associated point in time as a first point in time.

In various embodiments, the determining of the next rise in the signal level may include comparing the signal level rising after the drop with a predetermined second reference value, and when the second reference value is reached by the rising signal level, determining an associated point in time as a second point in time.

In various embodiments, the predetermined first reference value and the predetermined second reference value can form a predetermined combination of reference values.

In various embodiments, the predetermined first reference value and/or the predetermined second reference value can exhibit an absolute signal level or exhibit a relative signal level with respect to an initial signal level.

In various embodiments, the predetermined combination of reference values may include one from a group of reference value combinations, wherein the group includes a first combination, wherein the first reference value exhibits 2.2 V and the second reference value exhibits 3.5 V, a second combination, wherein the first reference value exhibits 0.8 V and the second reference value exhibits 2.0 V, a third combination, wherein the first reference value exhibits 1.39 V and the second reference value exhibits 3.8 V, a fourth combination, wherein the first reference value exhibits 0.4 V and the second reference value exhibits 75% of the initial signal level, and a fifth combination which is determined after a commissioning of a device for carrying out the method and/or in the case of a faultless transmission of the signal.

In various embodiments, the method can also include predetermining the minimum time interval in dependence on the predetermined combination of reference values.

In various embodiments, the method can furthermore include, in a case where the signal quality is evaluated as being poor, providing an information item that the signal quality is poor.

In various embodiments, the method can also have, in a case where the signal quality is evaluated as being poor, a triggering of a subsequent process, for example a replacing of a signal of poor quality by a corrected signal or a program interruption (also called interrupt).

In various embodiments, the method can furthermore include comparing the time interval with a predetermined maximum short-term interference signal period, determining of at least one new drop in the signal level after the rise in the signal level, determining a high-signal time interval between the rise and the new drop, comparing the second time interval with the predetermined maximum short-term interference signal period, in a case where the time interval and/or the high-signal time interval are/is shorter than the predetermined maximum short-term interference signal period or is equal to the predetermined maximum short-term interference signal period, evaluating the signal between the drop and the next rise and/or between the rise and the new drop as short-term interference signal, and correcting the signal by means of replacing the short-term interference signal by an undisturbed signal or by means of determining the time intervals, omitting points in time allocated to the short-term interference signal.

In various embodiments, a data receiving device is provided. The data receiving device can be configured for carrying out the method according to various embodiments.

In various embodiments, a data transmission device is provided. The data transmission device can have a data receiving device according to various embodiments and a data sending device for sending the Single-Edge Nibble Transmission Signal.

In various embodiments, the data sending device may include a sensor.

In various embodiments, the sensor may include a sensor used in a vehicle.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a Single-Edge Nibble Transmission Signal, the method comprising:
   determining of at least one drop in a signal level of the time-variable Single-Edge Nibble Transmission Signal and at least one next rise in the signal level after the drop in the signal level;
   determining a time interval between the drop and the next rise in the signal level; and
   determining a quality of the Single-Edge Nibble Transmission Signal by using the time interval,
   wherein the determining of the quality of the Single-Edge Nibble Transmission Signal comprises comparing the time interval with at least one of a predetermined minimum time interval or with a predetermined maximum time interval, and evaluating the signal quality as being poor by:
      determining the time interval is less than the predetermined minimum time interval or
      determining the time interval is greater than the predetermined maximum time interval.

2. The method of claim 1,
   wherein the determining of at least one drop in the signal level comprises:
      comparing the dropping signal level with a predetermined first reference value; and
      when the first reference value is reached by the dropping signal level, determining an associated point in time as a first point in time.

3. The method of claim 2,
   wherein the determining of the next rise in the signal level comprises:
      comparing the signal level rising after the drop with a predetermined second reference value; and
      when the second reference value is reached by the rising signal level, determining an associated point in time as a second point in time.

4. The method of claim 3,
   wherein the predetermined first reference value and the predetermined second reference value form a predetermined combination of reference values.

5. The method of claim 3,
   wherein at least one of the predetermined first reference value or the predetermined second reference value exhibit an absolute signal level or exhibit a relative signal level with respect to an initial signal level.

6. The method of claim 5,
   wherein the predetermined combination of reference values comprises one from a group of combinations of reference values, wherein the group comprises:
      a first combination, wherein the first reference value exhibits 2.2 V and the second reference value exhibits 3.5 V;
      a second combination, wherein the first reference value exhibits 0.8 V and the second reference value exhibits 2.0 V;
      a third combination, wherein the first reference value exhibits 1.39 V and the second reference value exhibits 3.8 V;
      a fourth combination, wherein the first reference value exhibits 0.4 V and the second reference value exhibits 75% of the initial signal level; and
      a fifth combination which is determined after a commissioning of a device for carrying out the method or in the case of a faultless transmission of the signal.

7. The method of claim 3,
   wherein the predetermined first reference value and the predetermined second reference value form a predetermined combination of reference values;
   the method further comprising predetermining the minimum time interval in dependence on the predetermined combination of reference values.

8. The method of claim 1, further comprising:
   evaluating the signal quality as being poor; and
   providing an information item that the signal quality is poor.

9. The method of claim 1, further comprising:
   comparing the time interval with a predetermined maximum short-term interference signal period;
   determining at least one new drop in the signal level after the rise in the signal level;
   determining a high-signal time interval between the rise and the new drop;
   comparing the second time interval with the predetermined maximum short-term interference signal period;
   wherein at least one of the time interval or the high-signal time interval is shorter than the predetermined maximum short-term interference signal period or equal to the predetermined maximum short-term interference signal period, evaluating the signal between the drop and the next rise and/or between the rise and the new drop as short-term interference signal; and
   correcting the signal by means of replacing the short-term interference signal by an undisturbed signal or by determining the time intervals, omitting points in time allocated to the short-term interference signal.

10. A data receiving device,
    configured to process a Single-Edge Nibble Transmission Signal by being configured to:
       determine of at least one drop in a signal level of the time-variable Single-Edge Nibble Transmission Signal and at least one next rise in the signal level after the drop in the signal level;
       determine a time interval between the drop and the next rise in the signal level; and
       determine a quality of the Single-Edge Nibble Transmission Signal by using the time interval,
    wherein to determine of the quality of the Single-Edge Nibble Transmission Signal comprises the data receiving device being configured to compare the time interval with at least one of a predetermined minimum time interval or with a predetermined maximum time interval, and configured to evaluate the signal quality as being poor if the time interval is less than the predetermined minimum time interval or if the time interval is greater than the predetermined maximum time interval.

11. A data transmission device, comprising:
a data receiving device configured to process a Single-Edge Nibble Transmission Signal, by being configured to:
  determine of at least one drop in a signal level of the time-variable Single-Edge Nibble Transmission Signal and at least one next rise in the signal level after the drop in the signal level;
  determine a time interval between the drop and the next rise in the signal level; and
  determine a quality of the Single-Edge Nibble Transmission Signal by using the time interval,
wherein to determine of the quality of the Single-Edge Nibble Transmission Signal comprises the data receiving device being configured to compare the time interval with at least one of a predetermined minimum time interval or with a predetermined maximum time interval, and configured to evaluate the signal quality as being poor if the time interval is less than the predetermined minimum time interval or if the time interval is greater than the predetermined maximum time interval; and
a data sending device for sending the Single-Edge Nibble Transmission Signal.

12. The data transmission device of claim 11, wherein the data sending device comprises a sensor.

13. The data transmission device of claim 12, wherein the sensor comprises a sensor used in a vehicle.

* * * * *